US011171627B2

(12) United States Patent
Inoue et al.

(10) Patent No.: US 11,171,627 B2
(45) Date of Patent: Nov. 9, 2021

(54) WAVE APODIZATION FOR GUIDED SAW RESONATORS

(71) Applicant: Qorvo US, Inc., Greensboro, NC (US)

(72) Inventors: Shogo Inoue, Longwood, FL (US); Hao Dong, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 12 days.

(21) Appl. No.: 16/400,363

(22) Filed: May 1, 2019

(65) Prior Publication Data

US 2020/0106418 A1    Apr. 2, 2020

Related U.S. Application Data

(60) Provisional application No. 62/739,654, filed on Oct. 1, 2018.

(51) Int. Cl.
*H03H 9/15* (2006.01)
*H03H 9/25* (2006.01)
*H03H 9/13* (2006.01)
*H03H 9/145* (2006.01)

(52) U.S. Cl.
CPC .......... *H03H 9/13* (2013.01); *H03H 9/14502* (2013.01)

(58) Field of Classification Search
CPC .................................. H03H 9/15; H03H 9/25
USPC ........................................................ 333/193
See application file for complete search history.

(56) References Cited

U.S. PATENT DOCUMENTS

| 6,791,236 | B1* | 9/2004 | Abramov | H03H 9/14505 310/313 B |
| 7,482,896 | B2 | 1/2009 | Wada et al. | |
| 7,522,021 | B2 | 4/2009 | Wada et al. | |
| 7,800,464 | B2* | 9/2010 | Tajima | H03H 9/02559 333/193 |
| 2004/0247153 | A1* | 12/2004 | Ruile | H03H 9/14544 381/431 |
| 2008/0309192 | A1* | 12/2008 | Nakao | H03H 9/1452 310/313 C |
| 2017/0222618 | A1* | 8/2017 | Inoue | H03H 9/02574 |

OTHER PUBLICATIONS

Inoue, Shogo, et al., "Low-Loss SAW Filter on Li2B4O7 using Novel-Shape Apodized Structure for 1 GHz RF-ID System," IEEE Ultrasonics Symposium, Sep. 2005, pp. 1036-1041.

* cited by examiner

*Primary Examiner* — Dean O Takaoka
(74) *Attorney, Agent, or Firm* — Withrow & Terranova, PLLC

(57) ABSTRACT

An acoustic resonator includes a piezoelectric layer on a substrate and an interdigital electrode structure on the piezoelectric layer. The interdigital electrode structure includes a first bus bar, a second bus bar, a first set of electrode fingers, and a second set of electrode fingers. The first bus bar and the second bus bar extend parallel to one another along a length of the interdigital electrode structure. The first set of electrode fingers are coupled to the first bus bar and extend to a first apodization edge. The second set of electrode fingers are coupled to the second bus bar and extend to a second apodization edge. The first set of electrode fingers and the second set of electrode fingers are interleaved. At least one of the first apodization edge and the second apodization edge provides a wave pattern along the length of the interdigital electrode structure.

26 Claims, 11 Drawing Sheets

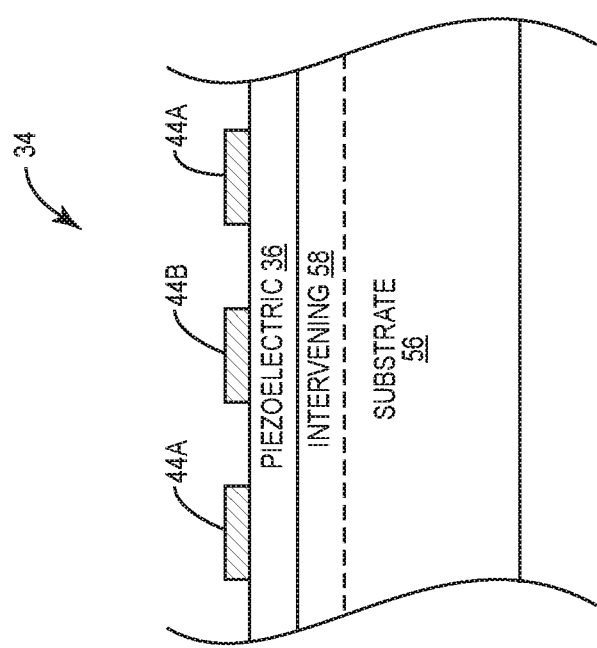

WAVE APODIZATION FOR GUIDED SAW RESONATORS

RELATED APPLICATIONS

This application claims the benefit of provisional patent application Ser. No. 62/739,654, filed Oct. 1, 2018, the disclosure of which is hereby incorporated herein by reference in its entirety.

FIELD OF THE DISCLOSURE

The present disclosure is related to acoustic resonator devices, and in particular to surface acoustic wave (SAW) resonators including wave apodization for improved performance.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Exemplary acoustic wave devices include surface acoustic wave (SAW) resonators and bulk acoustic wave (BAW) resonators, which are increasingly used to form filters used in the transmission and reception of radio frequency (RF) signals for communication. Due to the stringent demands placed on filters for modern RF communications systems, acoustic wave devices for these applications must provide high quality factor, wide bandwidth (i.e., high electromechanical coupling coefficient), and be small in size. Often, undesired oscillations or vibrations are transduced in the piezoelectric material of an acoustic wave device which degrade the performance thereof. These undesired oscillations or vibrations are often referred to as spurious modes.

FIG. 1 shows a top-down view of a conventional SAW resonator 10. The conventional SAW resonator 10 includes a piezoelectric layer 12, an interdigital electrode structure 14 on the piezoelectric layer 12, and a number of reflectors 16 on either side of the interdigital electrode structure 14. The interdigital electrode structure 14 includes a first bus bar 18A, a second bus bar 18B, a first set of electrode fingers 20A, a second set of electrode fingers 20B, a first set of dummy electrodes 22A, and a second set of dummy electrodes 22B. The first bus bar 18A and the second bus bar 18B extend along a length l of the interdigital electrode structure 14. The first set of electrode fingers 20A and the second set of electrode fingers 20B extend perpendicularly from the first bus bar 18A and the second bus bar 18B, respectively, and are interleaved with one another to form the comb structure illustrated in FIG. 1. Specifically, the first set of electrode fingers 20A extends from the first bus bar 18A towards the second bus bar 18B to a first apodization edge 24A. The second set of electrode fingers 20B extend from the second bus bar 18B towards the first bus bar 18A to a second apodization edge 24B. The first set of dummy electrodes 22A extends from the first bus bar 18A towards the second apodization edge 24B such that a first dummy electrode gap 26A exists between each one of the first set of dummy electrodes 22A and the second apodization edge 24B. The second set of dummy electrodes 22B extend from the second bus bar 18B towards the first apodization edge 24A such that a second dummy electrode gap 26B exists between each one of the second set of dummy electrodes 22B and the first apodization edge 24A. The reflectors 16 are provided as a set of parallel reflector bus bars 28 interconnected with a number of reflector bars 30. The reflectors 16 are provided adjacent to the interdigital electrode structure 14 along a height h thereof, such that the reflectors 16 bookend the interdigital electrode structure 14.

FIG. 2 shows a cross-sectional view of the conventional SAW resonator 10. As shown, the conventional SAW resonator 10 is a guided SAW resonator, and thus includes a substrate 32 on which the piezoelectric layer 12 is provided. A number of the first set of electrode fingers 20A and the second set of electrode fingers 20B are also shown.

The interdigital electrode structure 14 shown in FIG. 1 is not apodized. Accordingly, the first apodization edge 24A and the second apodization edge 24B are parallel to the first bus bar 18A and the second bus bar 18B. In an effort to reduce spurious modes in the conventional SAW resonator 10, apodization of the interdigital electrode structure 14 has been proposed as shown in FIG. 3. The conventional SAW resonator 10 shown in FIG. 3 is substantially similar to that discussed above with respect to FIG. 1, except that the first apodization edge 24A and the second apodization edge 24B form a pattern along a horizontal axis of the interdigital electrode structure 14 such that the interdigital electrode structure 14 is apodized. Specifically, defining a horizontal axis of the interdigital electrode structure 14 (an axis parallel to the length l of the interdigital electrode structure 14) as an x axis and a vertical axis of the interdigital electrode structure 14 (an axis parallel to the height h of the interdigital electrode structure 14) as a y axis, the first apodization edge 24A and the second apodization edge 24B are provided as a half period of $y = \cos^- x$ or $x = \cos y$. As discussed above, the first set of electrode fingers 20A extend from the first bus bar 18A to the first apodization edge 24A and the second set of electrode fingers 20B extend from the second bus bar 18B to the second apodization edge 24B. Accordingly, changing the shape of the first apodization edge 24A and the second apodization edge 24B changes the length of each one of the first set of electrode fingers 20A and the second set of electrode fingers 20B such that the length of adjacent ones of the first set of electrode fingers 20A and the second set of electrode fingers 20B are different from one another. This in turn changes the amount of overlap between adjacent ones of the first set of electrode fingers 20A and the second set of electrode fingers 20B, as well as the shape of the active area of the device. The shape of the first apodization edge 24A and the second apodization edge 24B shown in FIG. 3 is often referred to as "regular" apodization. Those skilled in the art will readily appreciate that regular apodization reduces undesired spurious modes. However, regular apodization also degrades quality factor and electromechanical coupling coefficient, and further requires an increase in size to maintain the same capacitance as a non-apodized resonator due to a decrease in the active area of the device.

In light of the above, there is a present need for acoustic devices with reduced spurious modes, high quality factor, high electromechanical coupling coefficient, and small size.

SUMMARY

In one embodiment, an acoustic resonator includes a piezoelectric layer and an interdigital electrode structure on the piezoelectric layer. The interdigital electrode structure includes a first bus bar, a second bus bar, a first set of electrode fingers, and a second set of electrode fingers. The first bus bar and the second bus bar extend parallel to one another along a length of the interdigital electrode structure. The first set of electrode fingers is coupled to the first bus bar and extends towards the second bus bar to a first apodization edge. The second set of electrode fingers is coupled to the second bus bar and extends towards the first bus bar to a second apodization edge. The first set of electrode fingers and the second set of electrode fingers are interleaved. At least one of the first apodization edge and the second apodization edge provides a wave pattern along the length of the interdigital electrode structure. By providing a wave pattern with one of the first apodization edge and the second apodization edge, spurious modes in the acoustic resonator may be reduced while maintaining a high quality factor and electromechanical coupling coefficient and reducing size.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 5 illustrates a cross-sectional view of an acoustic resonator according to one embodiment of the present disclosure.

DETAILED DESCRIPTION

Figure 1:
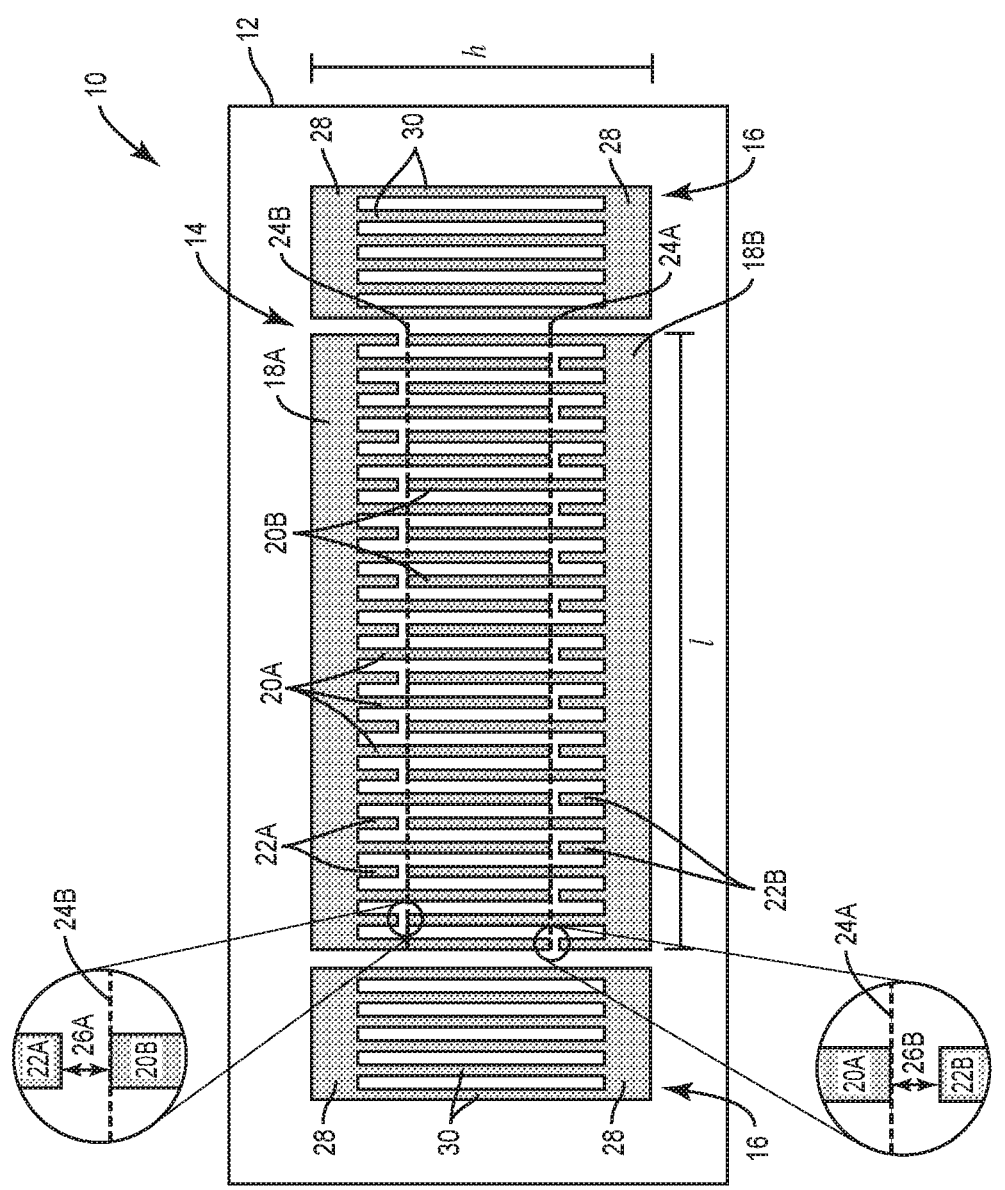
FIG. 1 illustrates a top-down view of a conventional surface acoustic wave (SAW) resonator.
Figure 2:
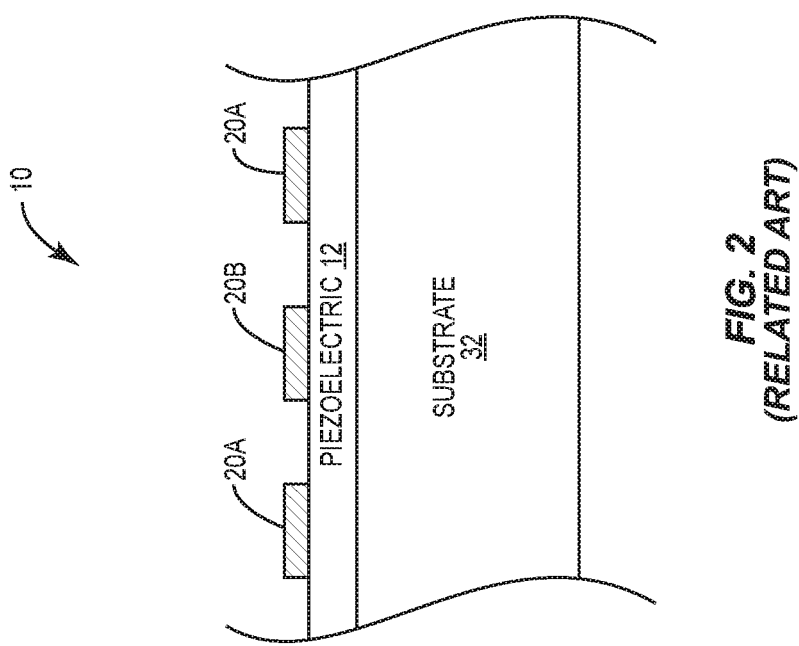
FIG. 2 illustrates a cross-sectional view of a conventional guided SAW resonator.
Figure 3:
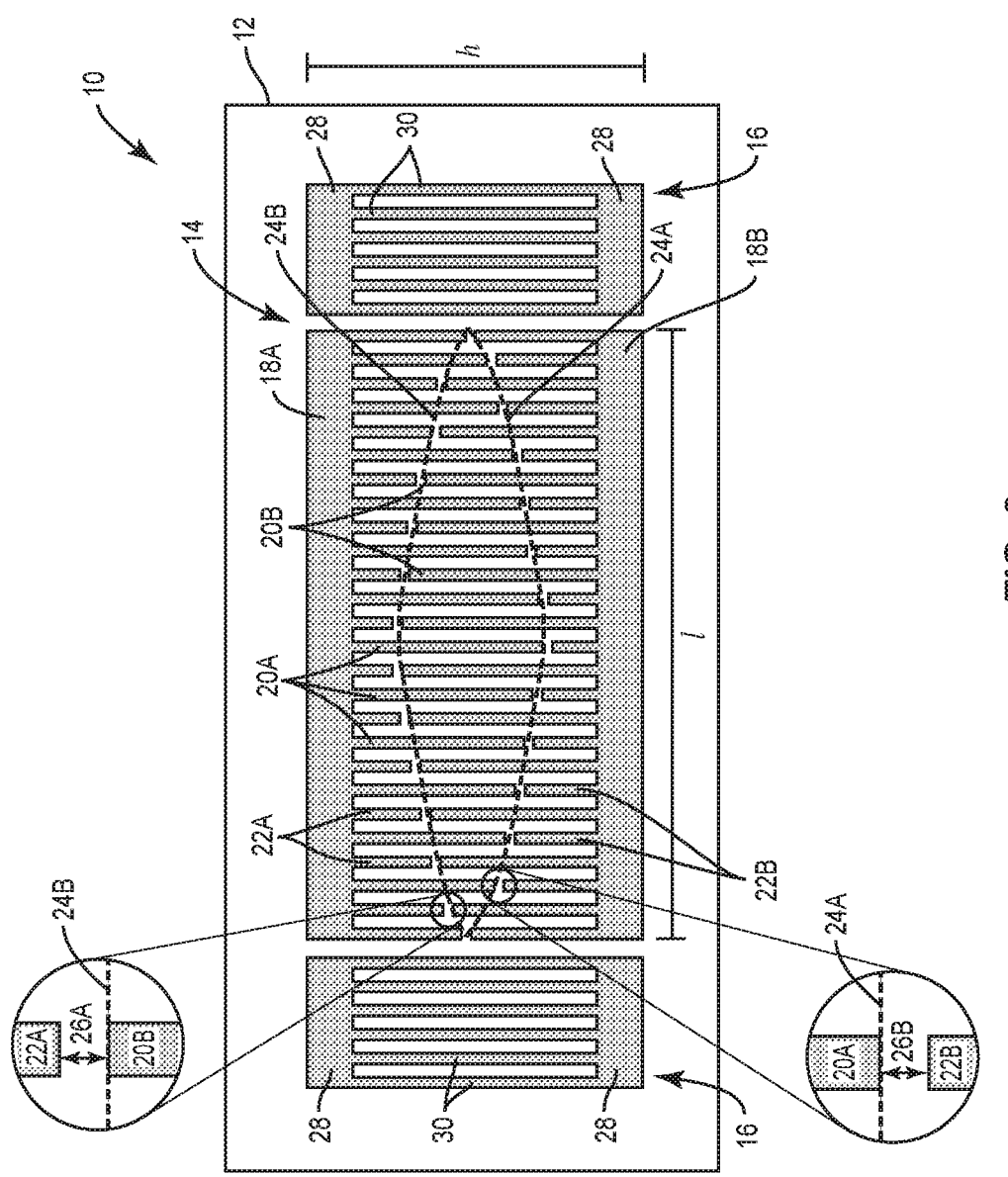
FIG. 3 illustrates a top-down view of a conventional SAW resonator with regular apodization.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 4:
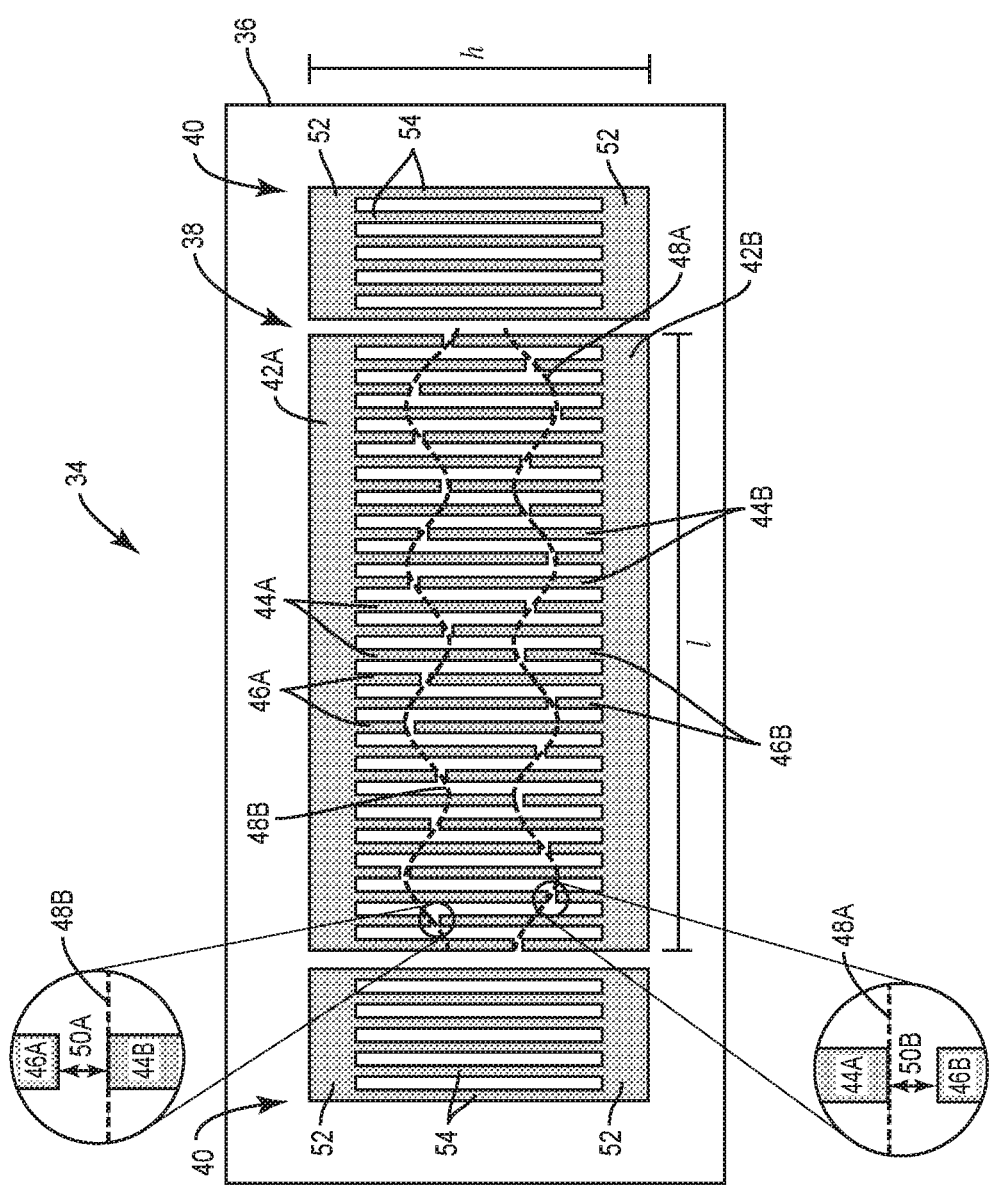
FIG. 4 illustrates a top-down view of an acoustic resonator according to one embodiment of the present disclosure.

FIG. 4 shows a top-down view of an acoustic resonator 34 according to one embodiment of the present disclosure. The acoustic resonator 34 includes a piezoelectric layer 36, an interdigital electrode structure 38 on the piezoelectric layer 36, and a number of reflectors 40 on either side of the interdigital electrode structure 38. The interdigital electrode structure 38 includes a first bus bar 42A, a second bus bar 42B, a first set of electrode fingers 44A, a second set of electrode fingers 44B, a first set of dummy electrodes 46A, and a second set of dummy electrodes 46B. The first bus bar 42A and the second bus bar 42B extend along a length l of the interdigital electrode structure 38. The first set of electrode fingers 44A and the second set of electrode fingers 44B extend perpendicularly from the first bus bar 42A and the second bus bar 42B, respectively, and are interleaved with one another to form the comb structure illustrated in FIG. 4. Specifically, the first set of electrode fingers 44A extends from the first bus bar 42A towards the second bus bar 42B to a first apodization edge 48A. The second set of electrode fingers 44B extends from the second bus bar 42B towards the first bus bar 42A to a second apodization edge 48B. The first set of dummy electrodes 46A extends from the first bus bar 42A towards the second apodization edge 48B such that a first dummy electrode gap 50A exists between each one of the first set of dummy electrodes 46A and the second apodization edge 48B. The second set of dummy electrodes 46B extends from the second bus bar 42B towards the first apodization edge 48A such that a second dummy electrode gap 50B exists between each one of the second set of dummy electrodes 46B and the first apodization edge 48A. The reflectors 40 are provided as a set of parallel reflector bus bars 52 interconnected with a number of reflector bars 54. The reflectors 40 are provided adjacent to the interdigital electrode structure 38 along a height h thereof, such that the reflectors 40 bookend the interdigital electrode structure 38.

FIG. 5 shows a cross-sectional view of the acoustic resonator 34 according to one embodiment of the present disclosure. The acoustic resonator 34 includes a substrate 56 on which the piezoelectric layer 36 is provided. A number of the first set of electrode fingers 44A and the second set of electrode fingers 44B are also shown. An optional intervening layer 58 may be provided between the substrate 56 and the piezoelectric layer 36. The intervening layer 58 may comprise silicon oxide ($SiO_2$) or any other suitable material. The substrate 56 may comprise silicon, sapphire, spinel, quartz, or another ceramic material. The piezoelectric layer 36 may comprise lithium tantalate ($LiTaO_3$), lithium niobate ($LiNbO_3$), or the like.

Notably, the first apodization edge 48A and the second apodization edge 48B are provided in a wave pattern. As defined herein, a wave pattern includes at least one full period of an oscillating function starting at a horizontal axis and providing both a peak above the horizontal axis and a trough below the horizontal axis. An exemplary wave pattern is a sinusoid including at least one full period as is illustrated in FIG. 4. However, any function meeting this criteria can be used without departing from the principles of the present disclosure. The oscillation between the peak and trough may be smooth, as in the case of a sinusoid, or may include some deviation or "noise" such that the oscillation is not completely smooth. In the embodiment shown in FIG. 4, the first apodization edge 48A and the second apodization edge 48B are sinusoids that are symmetric about a horizontal axis of the interdigital electrode structure 38 (an axis parallel to the length l of the interdigital electrode structure 38). Specifically, defining the horizontal axis of the interdigital electrode structure 38 as an x axis and a vertical axis (an axis parallel to the height h of the interdigital electrode structure 38) as a y axis, the first apodization edge 48A and the second apodization edge 48B are provided according to the function $y=\sin x$. Providing the interdigital electrode structure 38 in this manner reduces spurious modes while maintaining desirable quality factor, electromechanical coupling coefficient, and size.

Figure 6A:
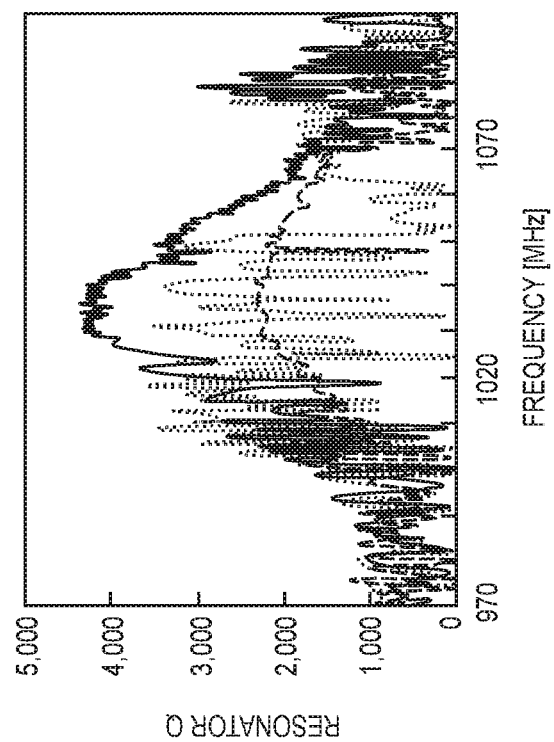
FIGS. 6A and 6B are graphs illustrating the performance of an acoustic resonator according to one embodiment of the present disclosure.
Figure 6B:
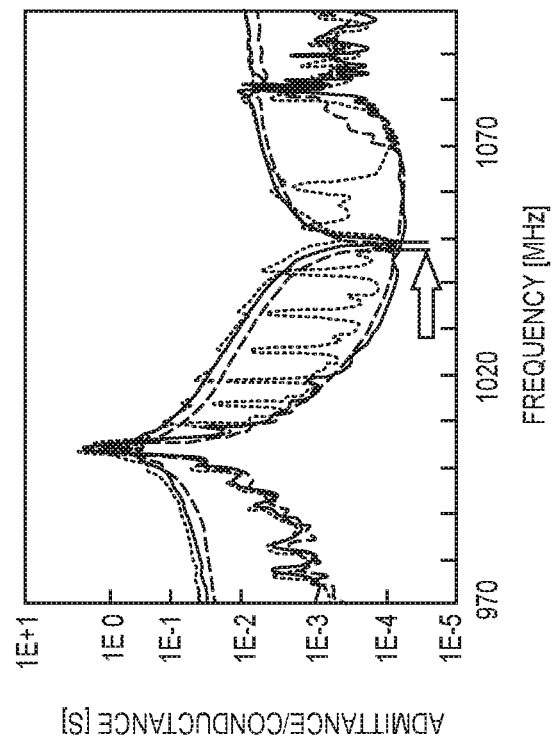

FIGS. 6A and 6B are graphs illustrating the performance of the acoustic resonator 34 compared to conventional devices. Specifically, FIG. 6A is a graph illustrating the admittance and conductance of a conventional SAW resonator (dotted line), a regularly apodized conventional SAW resonator (dashed line), and the acoustic resonator 34 (solid line) with respect to frequency. FIG. 6B is a graph illustrating the quality factor of a conventional SAW resonator (dotted line), a regularly apodized conventional SAW resonator (dashed line), and the acoustic resonator 34 (solid line). As shown in these figures, the acoustic resonator 34 significantly reduces spurious modes when compared to the conventional SAW resonator while also providing significant improvements in quality factor and electromechanical coupling coefficient compared to the regularly apodized conventional SAW resonator. Further, the acoustic resonator 34 provides a higher capacitance than the regularly apodized conventional SAW resonator, which allows the acoustic resonator 34 to have a smaller size.

Figure 7:
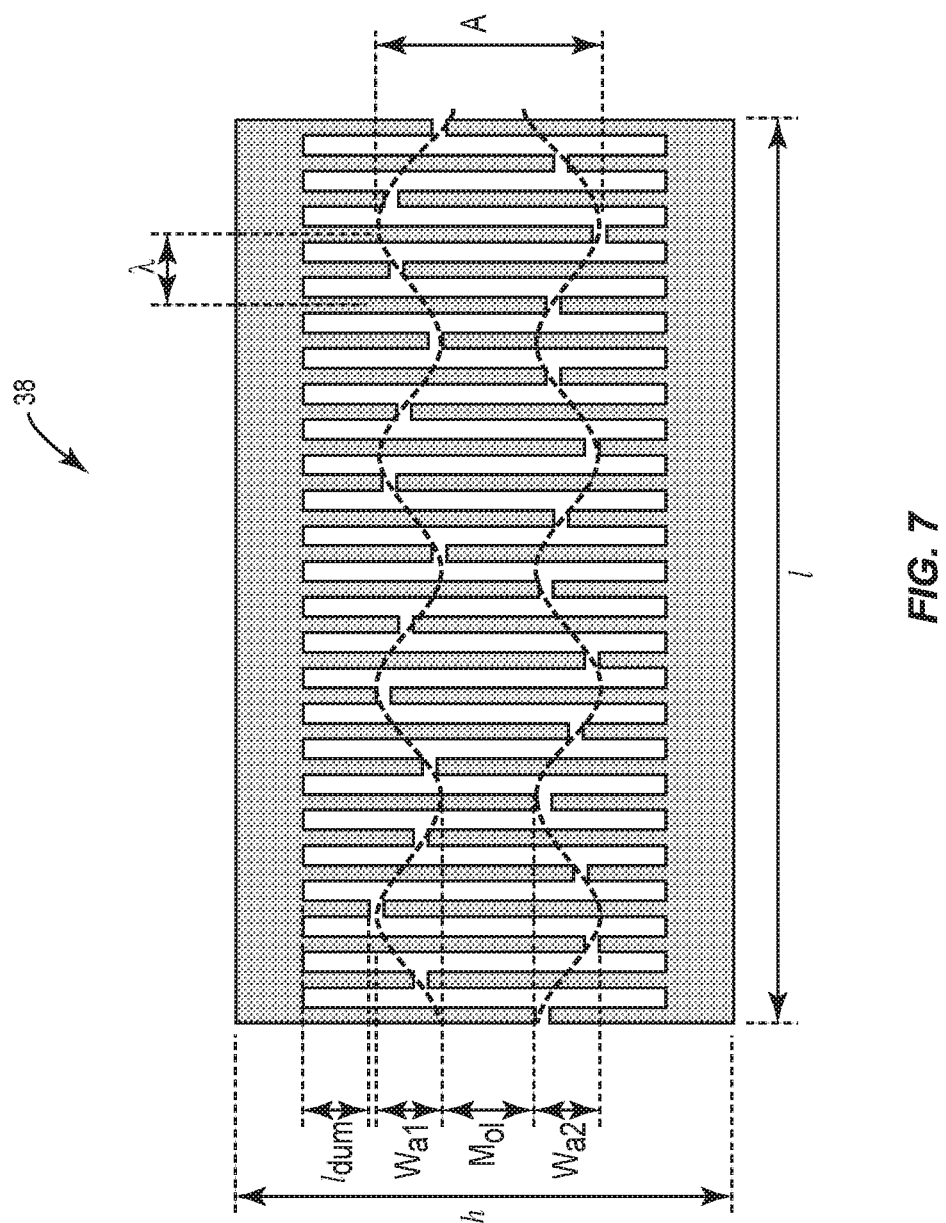
FIG. 7 illustrates an interdigital electrode structure according to one embodiment of the present disclosure.

As discussed above, the first apodization edge 48A and the second apodization edge 48B are provided in a wave pattern. The inventors of the subject matter of the present disclosure discovered that certain constraints on the wave pattern in a guided SAW device may lead to a better tradeoff between a reduction in spurious modes, quality factor, electromechanical coupling coefficient, and size. Accordingly, FIG. 7 shows details of the interdigital electrode structure 38 according to one embodiment of the present disclosure. FIG. 7 highlights certain features of the interdigital electrode structure 38, such as an aperture A, a wave amplitude $W_a$, a minimum overlap $M_{ol}$ of adjacent electrodes, a length l of the interdigital electrode structure 38, and a height h of the interdigital electrode structure 38. The aperture A is the maximum distance between the first apodization edge 48A and the second apodization edge 48B. The wave amplitude $W_a$, is the distance between the highest peak and the lowest valley of the first apodization edge 48A and the second apodization edge 48B. In some embodiments discussed below, the wave amplitude $W_a$, may be different for the first apodization edge 48A and the second apodization edge 48B. Accordingly, the wave amplitude of the first apodization edge 48A and the wave amplitude of the second apodization edge 48B may be separately labeled $W_{a2}$ and $W_{a1}$, respectively. The minimum overlap $M_{ol}$ between adjacent electrodes is the minimum amount that electrodes in the first set of electrode fingers 44A overlap with electrodes in the second set of electrode fingers 44B. The length l of the interdigital electrode structure 38 is the length of the first bus bar 42A and the second bus bar 42B. The height h of the interdigital electrode structure 38 is the measurement perpendicular to the length l. FIG. 7 further illustrates the electrode pitch of the interdigital electrode structure 38, which is shown as A due to the correspondence of this value with the acoustic wavelength of the device. Finally, FIG. 7 illustrates a minimum dummy electrode length $l_{dum}$, which is the length of the smallest dummy electrode in the first set of dummy electrodes 46A and the second set of dummy electrodes 46B. In some embodiments discussed below, the minimum dummy electrode length $l_{dum}$, may be different for the first set of dummy electrodes 46A and the second set of dummy electrodes 46B.

Certain values for the wave amplitude $W_a$ may affect the performance of the acoustic resonator 34. For an aperture A of 20λ, a length l of 100λ, and a length per period of the wave pattern of the first apodization edge 48A and the second apodization edge 48B of $$\frac{10\lambda}{period},$$

values for the wave amplitude $W_a$ between 1.0λ and 5.0λ may maximize a quality factor of the acoustic resonator 34. Values for the wave amplitude $W_a$ between 1.5λ and 3.0λ, between 1.7λ and 2.8λ, and between 1.8λ and 2.6λ may provide further performance improvements in some embodiments.

Certain values for the length per period of the wave pattern of the first apodization edge 48A and/or the second apodization edge 48B may affect the performance of the acoustic resonator 34. For an aperture A of 20λ, a length l of 100λ, and a wave amplitude $W_a$ of 2λ, providing the first apodization edge 48A and the second apodization edge 48B such that the wave pattern thereof has between 3 and 15 periods may maximize a quality factor and minimize spurious modes of the acoustic resonator 34. Accordingly, values for the length per period of the wave pattern of the first apodization edge 48A and/or the second apodization edge 48B between 6λ and 34λ, between 7λ and 25λ, and between 8λ and 17λ may be used in various embodiments.

In some embodiments, the pattern of the first apodization edge 48A and/or the second apodization edge 48B may be provided according to Equation (1):

$$y = |\cos 2\pi x|^P \mathrm{sign}(\cos 2\pi x) \quad (1)$$

Where y is the normalized wave function, x is the normalized position parallel to the length l of the interdigital electrode structure 38, and one period corresponds to x=1. Certain values for P may affect the performance of the acoustic resonator 34. For an aperture A of 20λ, a length l of 100λ, a wave amplitude $W_a$ of 2λ, and a length per period of the wave function of the first apodization edge 48A and/or the second apodization edge 48B of $$\frac{12.5\lambda}{period},$$

values of P between 0.5 and 2.5, between 0.75 and 2.0, and between 0.85 and 1.75 may maximize a quality factor and minimize spurious modes of the acoustic resonator 34. Notably, the above values may apply for any function generating a sinusoid including an exponential factor, and not only to Equation (1).

Certain values for the minimum dummy electrode length $l_{dum}$ may affect the performance of the acoustic resonator 34. For an aperture A of 20λ, a length l of 100λ, a wave amplitude $W_a$ of 2λ, and a length per period of the wave function of the first apodization edge 48A and/or the second apodization edge 48B of $$\frac{12.5\lambda}{period},$$

values of the minimum dummy electrode length $l_{dum}$ between 0λ (i.e., no dummy electrode) and 2.0λ, and more specifically 0λ and 0.5λ, and more specifically 0λ of minimum dummy electrode length may maximize a quality factor of the acoustic resonator 34.

Certain values for the minimum overlap $M_{ol}$ may affect the performance of the acoustic resonator 34. Performance benefits may be achieved when the minimum overlap $M_{ol}$ is greater than 1λ, greater than 2λ, greater than 3λ, greater than 4λ, greater than 5λ, greater than 10λ, greater than 15λ, and greater than 20λ.

Figure 8:
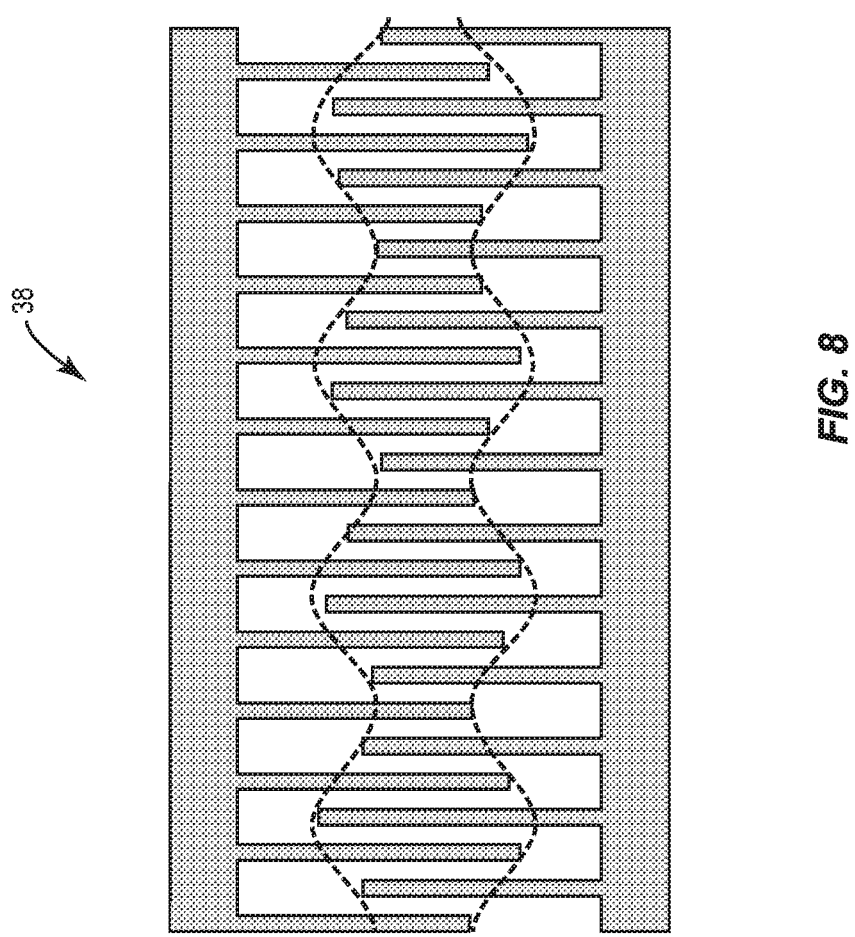
FIG. 8 illustrates an interdigital electrode structure according to one embodiment of the present disclosure.

FIG. 8 illustrates the interdigital electrode structure 38 where there are no dummy electrodes. In other words, FIG. 8 shows the interdigital electrode structure 38 without the first set of dummy electrodes 46A and the second set of dummy electrodes 46B. This type of interdigital electrode structure also may maximize a quality factor and minimize spurious modes of the acoustic resonator.

Figure 9A:
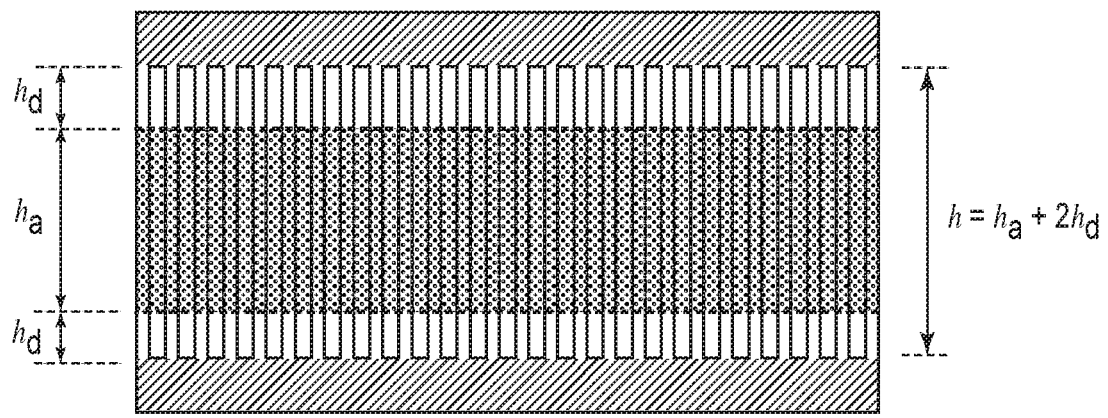
FIGS. 9A through 9C illustrate an active area of an acoustic resonator according to one embodiment of the present disclosure.
Figure 9B:
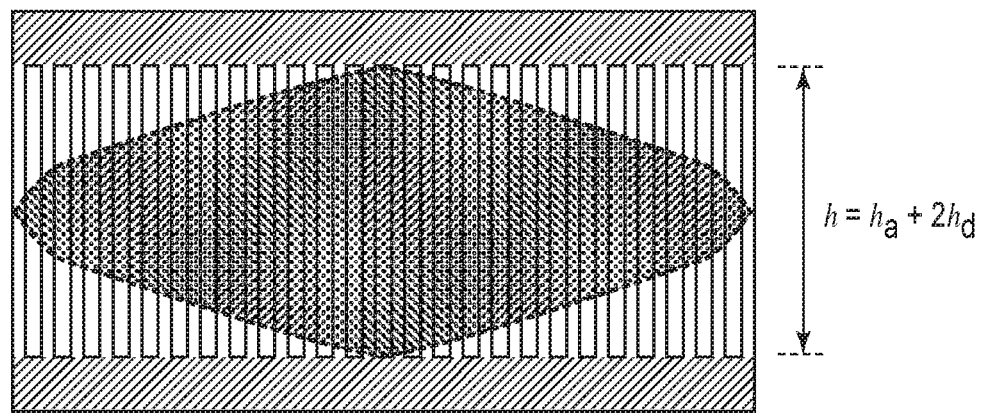
Figure 9C:
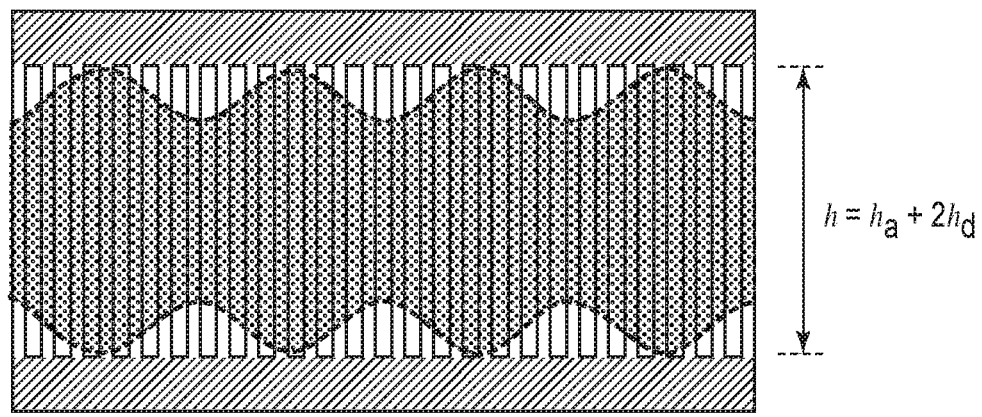

As discussed above, the apodization of the interdigital electrode structure 38 may maximize an active area of the acoustic resonator 34 and therefore allow the size of the acoustic resonator 34 to remain small while providing a desirable capacitance. FIGS. 9A through 9C illustrate the active area of a conventional SAW resonator, a regularly apodized conventional SAW resonator, and the acoustic resonator 34 described herein. Specifically, FIG. 9A illustrates the active area of a conventional SAW resonator without apodization. As shown, a total height h of the area between the first bus bar 42A and the second bus bar 42B includes a height of the active area $h_a$ (where the active area is defined as the area where the first set of electrode fingers 44A and the second set of electrode fingers 44B overlap one another), and two times the height of the dummy electrodes $h_d$. Accordingly, the active area ratio (i.e., the ratio of active area to total area of the interdigital electrode structure) of the conventional SAW resonator without apodization is defined as $$\frac{h_a}{h_a + 2h_d}.$$

Assuming $h_a$ is 20λ and $h_d$ is 2λ, the active area ratio of the conventional SAW resonator without apodization is 83%. FIG. 9B illustrates the active area of a regularly apodized conventional SAW resonator. The active area ratio of the regularly apodized SAW resonator is $$\frac{2}{\pi} = 64\%.$$

FIG. 9C illustrates the active area ratio of the acoustic resonator 34 according to the present disclosure. The active area of the acoustic resonator 34 having an aperture A equal to $h_a + 2h_d$ (the entire height of the interdigital electrode structure) and a wave amplitude $W_a$ of 2λ has an active area ratio defined as $$\frac{h_a + 2\lambda}{h_a + 2h_d}.$$

Assuming $h_a$ is 20λ and $h_d$ is 2λ, the active area ratio of the acoustic resonator is 92%, which is significantly larger than the regularly apodized conventional SAW resonator and even larger than the conventional SAW resonator without apodization. This allows the acoustic resonator 34 to be smaller than conventional devices while providing similar or better performance.

For surface acoustic resonator devices such as the one shown above in FIG. 5, spurious modes generally only become an issue when a thickness of the piezoelectric layer 36 is below a certain value. In general, spurious modes become a problem for thicknesses of the piezoelectric layer 36 below 5λ, and become more problematic the thinner the piezoelectric layer 36 becomes. Accordingly, the principles of the present disclosure may be especially applicable to SAW devices where a thickness of the piezoelectric layer 36 is less than 5λ, less than 4λ, less than 3λ, less than 2λ, and less than 1λ.

Figure 10A:
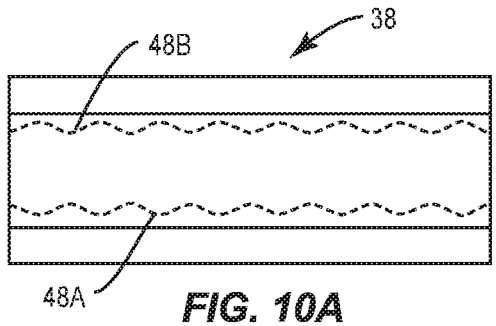
FIGS. 10A through 10H illustrate interdigital electrode structures according to various embodiments of the present disclosure.
Figure 10E:
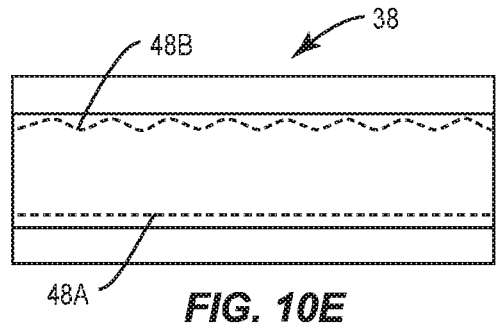
Figure 10B:
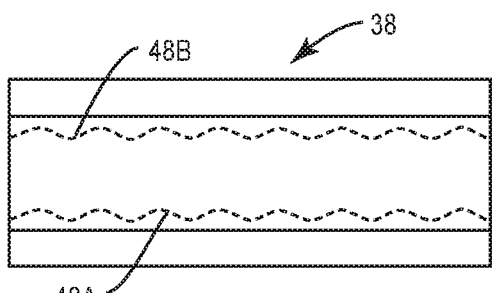
Figure 10F:
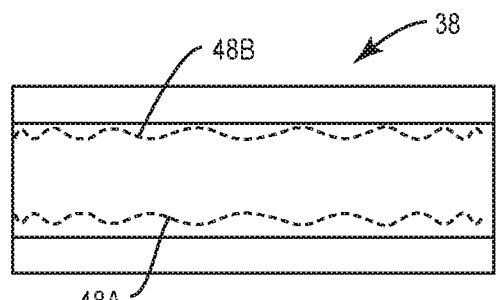
Figure 10C:
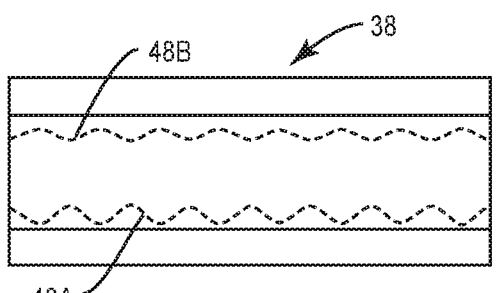
Figure 10G:
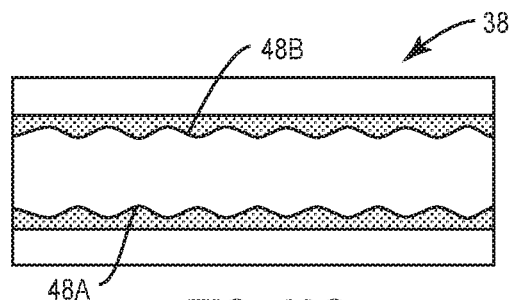
Figure 10D:
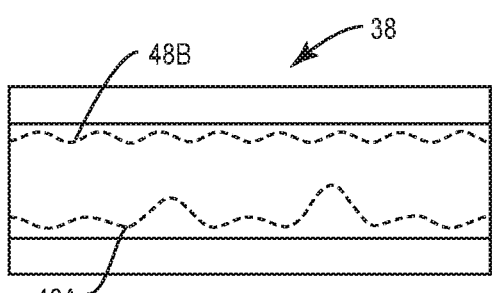
Figure 10H:
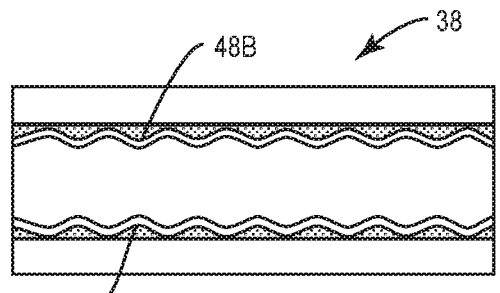

FIGS. 10A through 10H illustrate various configurations for the first apodization edge 48A and the second apodization edge 48B of the interdigital electrode structure 38 according to various embodiments of the present disclosure. Specifically, FIGS. 10A through 10H show different patterns that may be created by the first apodization edge 48A and the second apodization edge 48B, which may provide certain performance advantages in certain situations. FIG. 10A shows the first apodization edge 48A and the second apodization edge 48B as sinusoids that are symmetric about a horizontal axis of the interdigital electrode structure 38. FIG. 10B shows the first apodization edge 48A and the second apodization edge 48B as sinusoids that are parallel to one another such that the peaks and valleys thereof line up. FIG. 10C shows the first apodization edge 48A and the second apodization edge 48B as sinusoids having different wave amplitudes $W_a$. FIG. 10D shows the first apodization edge 48A and the second apodization edge 48B as sinusoids having different periods (i.e., a different number of waves per length l of the interdigital electrode structure 38), and also wherein the first apodization edge 48A has an amplitude that varies along the length l of the interdigital electrode structure. FIG. 10E shows the first apodization edge 48A as a straight line horizontal to the first bus bar 42A and the second bus bar 42B such that the first apodization edge does not provide a wave pattern and the second apodization edge 48B as a sinusoid. Notably, the arrangement of the first apodization edge 48A and the second apodization edge 48B may be switched in various embodiments. FIG. 10F shows the first apodization edge 48A and the second apodization edge 48B as a chirped wave that is symmetric about a vertical axis of the interdigital electrode structure 38 (an axis parallel to the height h of the interdigital electrode structure 38). FIG. 10G shows the interdigital electrode structure 38 wherein the first set of dummy electrodes 46A and the second set of dummy electrodes 46B are completely metallized such that no gaps exist therebetween. FIG. 10H shows the interdigital electrode structure 38 wherein the first set of dummy electrodes 46A and the second set of dummy electrodes are partially metallized such that gaps only exist over a subset of the length thereof.

Figure 11:
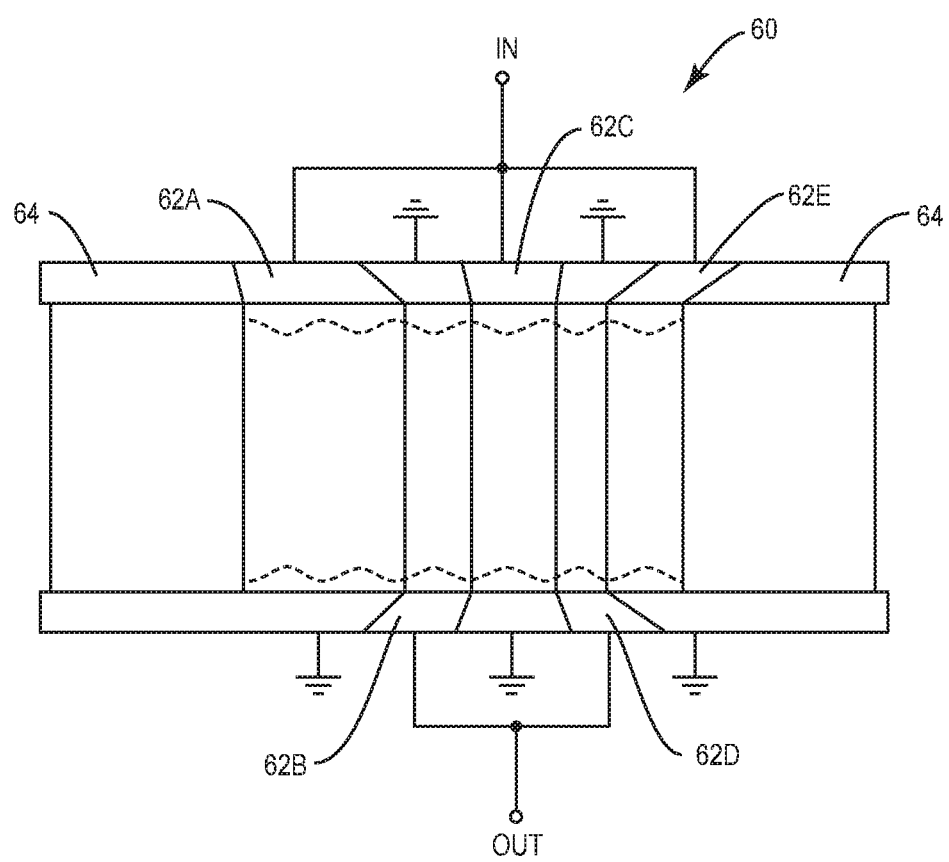
FIG. 11 illustrates a coupled resonator filter according to one embodiment of the present disclosure.

The acoustic resonator 34 described herein may form part of a coupled resonator filter 60 as illustrated in FIG. 11. As will be appreciated by those skilled in the art, a coupled resonator filter 60 includes multiple acoustic resonators arranged in a particular configuration to provide a desired filter response. As shown in FIG. 11, the coupled resonator filter 60 includes a number of acoustic resonators 62 (labeled individually as 62A through 62E) coupled between an input node IN, an output node OUT, and ground. The acoustic resonators 62 are arranged adjacent to one another, and include a wave apodization as described above, which may or may not be continuous across the acoustic resonators 62. A number of reflectors 64 are provided adjacent to a first one of the acoustic resonators 62A and a last one of the acoustic resonators 62E as shown.

Those skilled in the art will recognize improvements and modifications to the preferred embodiments of the present disclosure. All such improvements and modifications are considered within the scope of the concepts disclosed herein and the claims that follow.

What is claimed is:

1. An acoustic resonator comprising:
   a substrate;
   a piezoelectric layer on the substrate; and
   an interdigital electrode structure which is periodically apodized with a wave pattern having an amplitude between 1.0λ and 5.0λ on the piezoelectric layer, wherein the interdigital electrode structure is provided such that an active area of the acoustic resonator is greater than 85%.

2. The acoustic resonator of claim 1 wherein the interdigital electrode structure is provided such that the active area of the acoustic resonator is greater than 90%.

3. The acoustic resonator of claim 1 further comprising an intervening layer on the substrate, wherein the piezoelectric layer is on the intervening layer.

4. The acoustic resonator of claim 1 wherein a thickness of the piezoelectric layer is less than 5λ.

5. An acoustic resonator comprising:
   a substrate;
   a piezoelectric layer on the substrate; and
   an interdigital electrode structure on the piezoelectric layer, the interdigital electrode structure comprising:
      a first bus bar extending along a length of the interdigital electrode structure;
      a second bus bar parallel to the first bus bar;
      a first set of electrode fingers coupled to the first bus bar and extending towards the second bus bar to a first apodization edge; and
      a second set of electrode fingers coupled to the second bus bar and extending towards the first bus bar to a second apodization edge such that:
         the first set of electrode fingers and the second set of electrode fingers are interleaved; and
         at least one of the first apodization edge and the second apodization edge are defined by a wave pattern having an amplitude between 1.0λ and 5.0λ and a plurality of periods along the length of the interdigital electrode structure.

6. The acoustic resonator of claim 5 wherein the wave pattern comprises a plurality of periods of a sinusoid along the length of the interdigital electrode structure.

7. The acoustic resonator of claim 6 wherein the first apodization edge and the second apodization edge are defined by a pattern including a plurality of periods of a sinusoid along the length of the interdigital electrode structure.

8. The acoustic resonator of claim 7 wherein the first apodization edge is parallel to the second apodization edge.

9. The acoustic resonator of claim 7 wherein an amplitude of the sinusoidal pattern provided by the first apodization edge is different from an amplitude of the sinusoidal pattern provided by the second apodization edge.

10. The acoustic resonator of claim 9 wherein a period of the sinusoidal pattern provided by the first apodization edge is different from a period of the sinusoidal pattern provided by the second apodization edge.

11. The acoustic resonator of claim 7 wherein a period of the sinusoidal pattern provided by the first apodization edge is different from a period of the sinusoidal pattern provided by the second apodization edge.

12. The acoustic resonator of claim 7 wherein an amplitude of the sinusoidal pattern provided by one of the first apodization edge and the second apodization edge varies along the length of the interdigital electrode structure.

13. The acoustic resonator of claim 6 wherein an amplitude of the sinusoidal pattern provided by the at least one of the first apodization edge and the second apodization edge varies along the length of the interdigital electrode structure.

14. The acoustic resonator of claim 6 wherein:
the first apodization edge does not provide a pattern; and
the second apodization edge provides a sinusoidal pattern along the length of the interdigital electrode structure.

15. The acoustic resonator of claim 5 wherein the at least one of the first apodization edge and the second apodization edge provides a chirp pattern along the length of the interdigital electrode structure.

16. The acoustic resonator of claim 6 wherein an amplitude of at least one period of the sinusoidal pattern is between $1.5\lambda$ and $3.0\lambda$.

17. The acoustic resonator of claim 6 wherein a length of the interdigital electrode structure per period of the sinusoidal pattern is between $6\lambda$ and $34\lambda$.

18. The acoustic resonator of claim 6 wherein the sinusoidal pattern for at least one of the first apodization edge and the second apodization edge is provided by the equation:

$$y=|\cos 2\pi x|^P \operatorname{sign}(\cos 2\pi x)$$

where x is the normalized position parallel to the length of the interdigital electrode structure, y is the normalized wave function, and P is between 0.5 and 2.5.

19. The acoustic resonator of claim 5 further comprising:
a first set of dummy electrodes coupled to the second bus bar and extending towards the first apodization edge such that a first dummy electrode gap exists between each one of the first set of dummy electrodes and the first apodization edge; and
a second set of dummy electrodes coupled to the first bus bar and extending towards the second apodization edge such that a second dummy electrode gap exists between each one of the second set of dummy electrodes and the second apodization edge.

20. The acoustic resonator of claim 19 wherein a minimum length of the first set of dummy electrodes and the second set of dummy electrodes is less than $2.0\lambda$.

21. The acoustic resonator of claim 5 wherein an active area of the acoustic resonator is greater than 85%.

22. The acoustic resonator of claim 5 further comprising an intervening layer on the substrate, wherein the piezoelectric layer is on the intervening layer.

23. The acoustic resonator of claim 5 wherein a thickness of the piezoelectric layer is less than $5\lambda$.

24. The acoustic resonator of claim 5 wherein a minimum overlap between the first set of electrode fingers and the second set of electrode fingers is greater than $1\lambda$.

25. The acoustic resonator of claim 5 wherein an amplitude of at least one period of the wave pattern is between $1.5\lambda$ and $3.0\lambda$.

26. The acoustic resonator of claim 5 wherein a length of the interdigital electrode structure per period of the wave pattern is between $6\lambda$ and $34\lambda$.

\* \* \* \* \*

UNITED STATES PATENT AND TRADEMARK OFFICE
CERTIFICATE OF CORRECTION

PATENT NO. : 11,171,627 B2
APPLICATION NO. : 16/400363
DATED : November 9, 2021
INVENTOR(S) : Shogo Inoue and Hao Dong It is certified that error appears in the above-identified patent and that said Letters Patent is hereby corrected as shown below:

In the Specification

Column 2, Line 44, replace "y=cos⁻ x" with --$y=\cos^{-1} x$--.
Column 6, Line 62, replace "which is shown as A" with --which is shown as $\lambda$--.
Column 6, Line 64, replace "$l_{dun}$" with --$l_{dum}$--.
Column 8, Line 9, replace "greater than 22$\lambda$" with --greater than 2$\lambda$--.
Column 8, Line 66, replace "$h_d$ is 22" with --$h_d$ is 2$\lambda$--.

Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*